United States Patent
Corderman et al.

(10) Patent No.: US 6,491,967 B1
(45) Date of Patent: Dec. 10, 2002

(54) PLASMA SPRAY HIGH THROUGHPUT SCREENING METHOD AND SYSTEM

(75) Inventors: Reed Roeder Corderman, Niskayuna, NY (US); Yuk-Chiu Lau, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/694,254

(22) Filed: Oct. 24, 2000

(51) Int. Cl.[7] ................................................. C23C 4/00
(52) U.S. Cl. ............................ 427/8; 427/446; 427/454; 427/455
(58) Field of Search ........................... 427/8, 453, 454, 427/446, 455

(56) References Cited

U.S. PATENT DOCUMENTS

| | | | |
|---|---|---|---|
| 4,599,270 A | * 7/1986 | Rangaswamy et al. | 428/402 |
| 5,032,568 A | 7/1991 | Lau et al. | 505/737 |
| 5,143,854 A | 9/1992 | Pirrung et al. | |
| 5,362,523 A | * 11/1994 | Gorynin et al. | 427/446 |
| 5,773,141 A | 6/1998 | Hasz et al. | |
| 5,817,371 A | 10/1998 | Gupta et al. | |
| 5,866,271 A | 2/1999 | Stueber et al. | |
| 5,900,283 A | * 5/1999 | Vakil et al. | 427/453 |
| 6,020,075 A | 2/2000 | Gupta et al. | |
| 6,221,181 B1 | * 4/2001 | Bossmann et al. | 148/428 |

FOREIGN PATENT DOCUMENTS

| | | |
|---|---|---|
| EP | 570387 B1 | 12/1994 |
| EP | 902057 A2 | 3/1999 |

* cited by examiner

Primary Examiner—Katherine A. Bareford
(74) Attorney, Agent, or Firm—Paul J. DiConza; Noreen C. Johnson

(57) ABSTRACT

Combinatorial high throughput screening is used to rapidly investigate and screen a multiplicity of complex thermal barrier coating candidates. In the screening method, a solution of thermal barrier coating precursors is formed and injected into a plasma jet of an air plasma spray (APS). The plasma jet is directed toward a substrate to deposit a gradient film formed from the precursors onto the substrate. An APS torch system comprises an APS torch, solution precursor vessels connected to the torch through a mixing zone and injector, a substrate oriented with respect to the torch to receive a plasma spray film formed from solution precursors from the vessels and a controller. The controller is connected to the solution precursor vessels and the torch or substrate to control mixing of the solution precursors and to control orientation of the torch or substrate to deposit a gradient film onto the substrate from the plasma spray. A CHTS array comprises a substrate and a gradient film of candidate TBC materials deposited over the substrate.

15 Claims, 6 Drawing Sheets

PLASMA SPRAY HIGH THROUGHPUT SCREENING METHOD AND SYSTEM

BACKGROUND OF THE INVENTION

The present invention relates to a plasma spray method and system for high throughput screening. Particularly, the invention relates to a plasma spray method and system for selecting a thermal barrier coating.

A thermal barrier coating (TBC) is deposited onto gas turbine and other heat engine parts to reduce heat flow and to limit the operating temperature of the metal parts. To be effective, a TBC must have low thermal conductivity, strongly adhere to the part and remain adherent throughout many heating and cooling cycles. New gas turbine designs push the limits of current coating capability, particularly with regard to high temperature sintering, thermal conductivity and resistance to erosion, impact and corrosion. Hence, there is a great interest in improving thermal barrier coatings to permit operation of turbine engines at higher temperatures and to extend turbine engine part life.

Although thermal barrier coating chemistry has been extensively explored, few general principles have emerged that allow the prediction of a next generation coating material. Currently, discovery of new thermal barrier coatings depends on empirical or intuitive investigation often based on trial and error synthesis. There is a need for a method and system to investigate new thermal barrier coating candidates particularly the promising but complex multiple oxide coating candidates.

BRIEF SUMMARY OF THE INVENTION

The present invention provides a method and system to rapidly investigate and screen a multiplicity of complex thermal barrier coating candidates. The method comprises selecting a thermal barrier coating by combinatorial high throughput screening (CHTS).

In another embodiment, the invention is a method of forming a CHTS array, comprising forming a solution of thermal barrier coating precursors and injecting the solution into a plasma jet of an air plasma spray (APS). The plasma jet is directed toward a substrate to deposit a gradient film formed from the precursors onto the substrate.

In another embodiment, the invention is a method, comprising steps of (i) simultaneously forming a controlled pattern of candidate TBC coatings on a substrate; and (ii) evaluating the coatings.

In still another embodiment, the invention is an APS torch system, comprising an APS torch, solution precursor vessels connected to the torch through a mixing zone and injector, a substrate oriented with respect to the torch to receive a plasma spray coating formed from solution precursors from the vessels and a controller. The controller is connected to the solution precursor vessels and the torch or substrate to control mixing of the solution precursors and to control orientation of the torch or substrate to deposit a gradient film onto the substrate from the plasma spray.

Finally in another embodiment, the invention is a CHTS array, comprising a substrate and a gradient film of candidate TBC materials deposited over the substrate.

DETAILED DESCRIPTION OF THE INVENTION

In experimental reaction systems, each potential combination of reactant, catalyst and condition must be evaluated in a manner that provides correlation to performance in a production scale reactor. Combinatorial organic synthesis (COS) is a high throughput screening (HTS) methodology that was developed for pharmaceuticals. COS uses systematic and repetitive synthesis to produce diverse molecular entities formed from sets of chemical "building blocks." As with traditional research, COS relies on experimental synthesis methodology. However instead of synthesizing a single compound, COS exploits automation and iminiaturization to produce large libraries of compounds through successive stages, each of which produces a chemical modification of an existing molecule of a preceding stage. The libraries comprise compounds that can be screened for various activities.

The technique used to prepare such libraries involves a stepwise or sequential coupling of building blocks to form the compounds of interest. For example, Pirrung et al., U.S. Pat. No. 5,143,854 discloses a technique for generating arrays of peptides and other molecules using, for example, light-directed, spatially addressable synthesis techniques. Pirrung et al. synthesizes polypeptide arrays on a substrate by attaching photoremovable groups to the surface of the substrate, exposing selected regions of the substrate to light to activate those regions, attaching an amino acid monomer with a photoremovable group to the activated region and repeating the steps of activation and attachment until polypeptides of desired lengths and sequences are synthesized.

Combinatorial high throughput screening (CHTS) is a discovery strategy that applies combinatorial chemistry principles of COS to the high throughput screening of materials and processes, particularly industrial materials and processes. A CHTS method can be characterized by parallel reactions at a micro scale that produce a high number of data points, for example 100 to 1,000 data points produced per day or even 100,000 points per day.

In another aspect, CHTS can be described as a method comprising (A) an iteration of steps of (i) selecting a set of reactants; (ii) reacting the set and (iii) evaluating a set of products of the reacting step and (B) repeating the iteration of steps (i), (ii) and (iii) wherein a successive set of reactants selected for a step (i) is chosen as a result of an evaluating step (iii) of a preceding iteration.

In another CHTS method, a multiplicity of tagged reactants is subjected to an iteration of steps of (A) (i) simultaneously reacting the reactants, (ii) identifying a multiplicity of tagged products of the reaction and (B) evaluating the identified products after completion of a single or repeated iteration (A).

As described hereinafter, a typical CHTS can utilize advanced automated, robotic, computerized and controlled loading, reacting and evaluating procedures.

The invention relates to a CHTS approach to selecting a coating composition from a multiplicity of complex coating candidates. The present invention describes a method to produce libraries of multi-component TBC materials using air plasma spray (APS) of precursor materials to obtain TBC microstructures close to those obtained commercially. The precursor materials can be dissolved and injected into the APS plasma as an atomized solution. Several controlled flow rate liquid delivery pumps cam be added to the APS torch and the flow rates of these pumps can be synchronized to the position of the APS torch with respect to a substrate to produce a combinatorial coating library with continuous gradients.

In one APS process, powders of a coating material are injected into a thermal plasma (typically $H_2+N_2$ or $H_2+Ar$), where the powders are melted and propelled toward a substrate. In another APS process, a precursor metal ion solution is injected into the plasma for downstream deposition as a film coating. In this method, the solution with dissolved candidate coating precursors is introduced into the core of the thermal plasma where the precursors are atomized. The atomized precursors can be applied to the substrate in a manner to produce a gradient film of a mixed coating. Concentrations, proportions and constituency can be varied by use of the dissolved coating precursors. The liquid solutions are typically at room temperature or at a slightly elevated temperature in the range of about 100° C. to about 200° C. to reduce solution viscosity. In one embodiment, the injected precursors are in the form of a mixture of direct powder and dissolved precursor solution.

These and other features will become apparent from the drawings and following detailed discussion, which by way of example without limitation describes preferred embodiments of the present invention.

Figure 1:
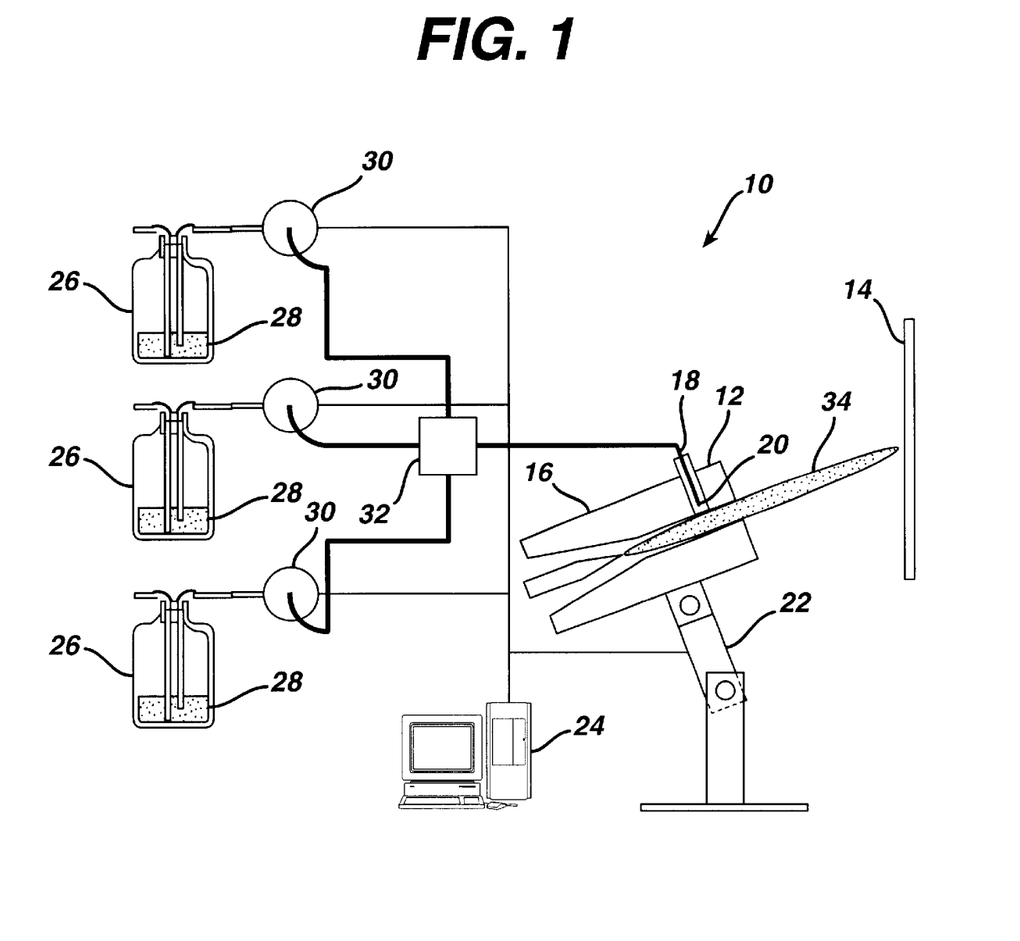
FIG. 1 is a schematic representation of a DC air plasma spray (APS) apparatus and system used to produce a gradient of candidate TBC materials.

FIG. 1 schematically illustrates a DC APS apparatus and system used to produce a gradient film of candidate TBC materials. In FIG. 1, system 10 includes APS apparatus 12 and substrate 14. Apparatus 12 includes APS torch 16, liquid injector 18 with pneumatic atomization nozzle 20, robotic positioning arm 22 and controller 24. Vessels 26 contain coating precursor solutions 28, which are charged to a mixing chamber 32 via pumps 30. The pumps 30 are computer-controlled flow rate liquid delivery pumps. The pumps 30 are connected to the liquid injector 18 of the APS torch 16. A Metco 7MB APS torch is an example of a suitable APS torch 16. The dissolved coating precursors 28 are mixed and injected into the pneumatic atomization nozzle 20 of the plasma torch 16. Injection into the 5,0000°–10,0000° K. thermal plasma jet 34 dissociates the precursors into an atomic vapor.

The position of the APS torch 16 with respect to substrate 14 is controlled by robotic arm 22 by means of controller 24. Controller 24 can control both robotic arm 22 and liquid delivery pumps 30 or two or more controllers can be used in concert to separately control robotic arm 22 and liquid delivery pumps 30. Controller 24 also controls flow rates of the liquid delivery pumps 30. The pumps 30 are synchronized to the position of the APS torch 16 with respect to the substrate 14. Synchronizing pumps 30 and torch 16 provides a combinatorial library of TBCs as a continuous gradient across the substrate 14. The system 10 can deposit about 0.002–0.005 in. (50–125 μm) of TBC onto substrate 14, which can be a Ni—, Fe— or Co-base superalloy, a steel such as used in a diesel engine or a ceramic material such as a SiC or $Si_3N_4$ composite or the like.

The robotic arm 22 that manipulates the plasma torch position may be any style of commercially available robot capable of linear traversing speeds of up to 1200–1500 mm/sec. Typically a 6-axis robot is used, however, a 2-axis x-y manipulator can also be used, in this case to control either the plasma torch or the substrate. One common commercially available example is a Fanuc M710i robot, with a RJ3 controller (FANUC Robotics, 3900 W. Hamlin Road, Rochester Hills, Mich. 48309 (800) 47-ROBOT).

The liquid delivery pumps 30 that transport liquid solutions from the solution vessels 26, through the solution mixing chamber 32, and to the APS gas atomization nozzle 20 can be any style of laboratory-size pumps. Peristaltic pumps are beneficial because there is no contamination of the liquid solution by the pump components (and vice versa). Centrifugal, gear, diaphragm, and piston pumps may also be used. One common commercially available example is a Cole-Parmer Masterflex® peristaltic pump (Cole-Parmer Instrument Company, 625 East Bunker Court, Vernon Hills, Ill. 60061), which can have a flow rate from 0.002 ml/min to 45 liters/min and can provide motor control through standard RS-232C digital signals, to allow for flow rate ramping and continuous dispensing operations.

The solutions that are pumped and atomized in the APS gas pneumatic atomization nozzle may be any type of aqueous or non-aqueous combination of solute and solvent. Key criteria for the solutions include: 1) solubility, 2) viscosity, and 3) environmental concerns. The solutions of coating precursors 28, can be aqueous solutions of metal salts. Aqueous inorganic metal nitrate, carbonate, sulfate, borate, aluminate, phosphate, etc. and organic acetate, methoxide, ethoxide, oxalate, etc. are suitable. Non-aqueous solutions of organometallic compounds may also be used. The solutions can have a viscosity similar to that of water, which will allow for easy pumping and atomization. As the solutions viscosity increases, then pumping, mixing, and atomization may become more difficult.

Acidic or basic solutions can be used to facilitate dissolution of the candidate TBC precursors. For example, solubility of $ZrO(NO_3)_2$, $Zr(NO_3)_3$, or $Y(NO_3)_3$ is increased in $HNO_3$. Basic solutions may be used to dissolve other materials such as metal nitrates, carbonates, sulfates, borates, aluminates, phosphates and organic acetates, methoxides, ethoxides, oxalates and the like.

Figure 2:
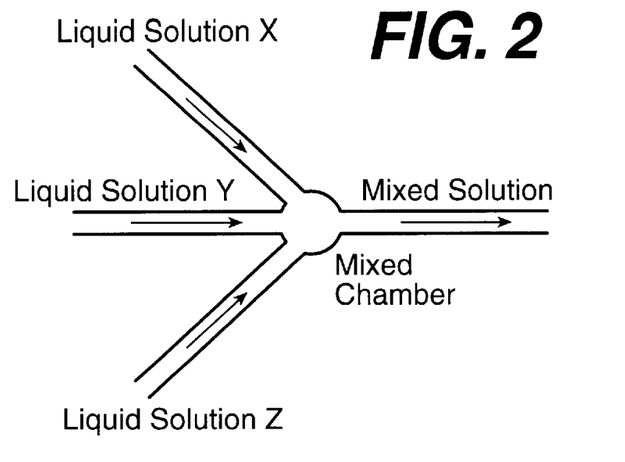
FIG. 2 is a schematic representation of a solution mixing chamber.
Figure 3:
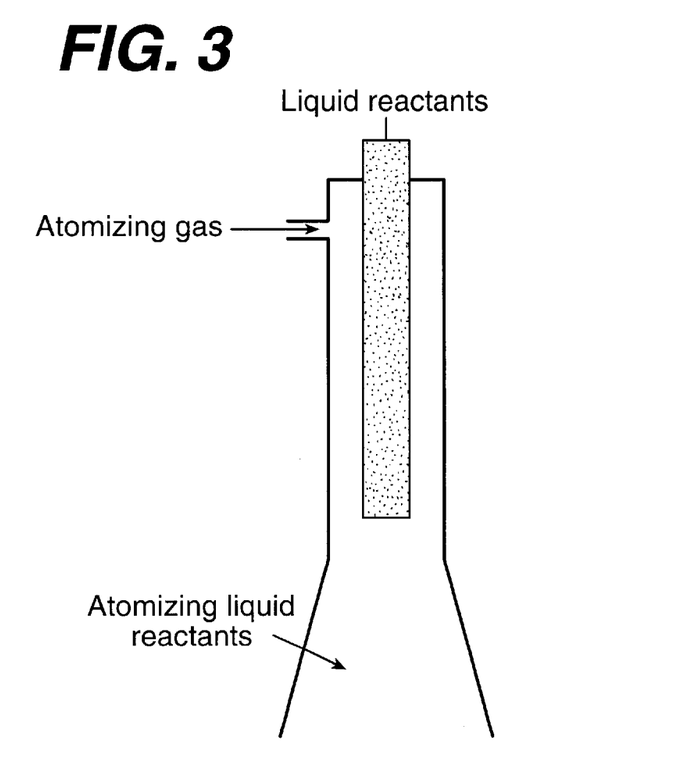
FIG. 3 is a schematic representation of a pneumatic or gas atomization nozzle.

A 3-inlet, 1-outlet mixer can be used for mixing the solutions prior to injection in the APS. A schematic of the solution mixer 16 is presented in FIG. 2. The individual solutions are each injected at flow rates of 0.002–250 ml/min, such that the maximum flow rate at the mixer outlet is about 250 ml/min An injector 18 with nozzle 20 can be used to gas atomize the solutions that are injected into the Air Plasma Spray (APS) torch. A schematic of a gas atomization nozzle is shown in FIG. 3. The solutions are injected at flow rates of 0.002–250 ml/min, while the atomizing gas (Ar or He) is injected at a flow rate of 10–20 scfh.

The following ranges of experimental conditions can be used for the Air Plasma Spray (APS)—liquid injection step of the method:

| | |
|---|---|
| Primary plasma gas: | 50 200 scfh, Nitrogen or Argon |
| Secondary plasma gas: | 0–100 scfh, Helium or Hydrogen |
| Carrier or atomizing gas: | 10–20 scfh, Nitrogen or Argon |
| Gun current: | 200–1500 amp |
| Gun traversing speed: | 10–1000 mm/sec |
| Spray distance: | 1–10 inches |
| Environment: | ambient air, inert (Ar box), low pressure (0.1–760 mm Hg) |
| Liquid feed rate: | 0.002–250 ml/min |
| Solution concentrations: | 0.001–5.0 moles/liter (or saturation concentration) |

-continued

| | |
|---|---|
| Substrate temperature: | ~100–1100° C. |
| Total spray time: | ~1–300 minutes |

The invention can be used to produce TBC materials in metal molar ratios of anywhere from very small (e.g. 1:10³) to very large (e.g. 1:1) amounts of second, third, fourth, etc. added constituent material(s). A gas turbine industry standard TBC material is 7-8YSZ (7–8 weight percent (w %) $Y_2O_3$, 93 w % $ZrO_2$) with a Y:Zr mole ratio of about 1:10.5–12.2.

Various solution vessel arrangements can be used to provide the candidate TBC coating. For example, Individual aqueous solutions of $Y_2O_3$, $ZrO_2$, and $CeO_2$ can be used to provide a 7 w % $Y_2O_3$, 92 w % $ZrO_2$ and 1 w % $CeO_2$ candidate coating. Alternatively, two solutions, one containing both $Y_2O_3$ and $ZrO_2$, and a second containing $CeO_2$ can be used to produce the same 7-92-1 candidate TBC coating. The $Y_2O_3$ and $ZrO_2$ solution would contain a metal mole ratio of about 1 Y to 12 Zr (1:12). Similarly, a single solution containing $Y_2O_3$, $ZrO_2$, and $CeO_2$ can be used to produce a candidate TBC coating. In this example, the metal mole ratio would be about 10.7 Y to 128.7 Zr to 1 Ce (10.7:128.7:1.0).

Figure 4:
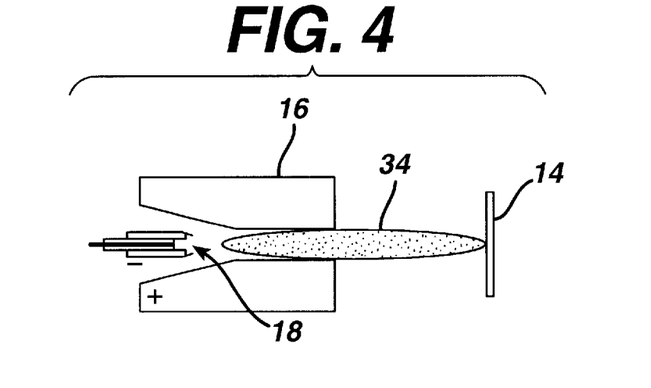
FIGS. 4, 5 and 6 are schematic representations of DC APS torches.
Figure 5:
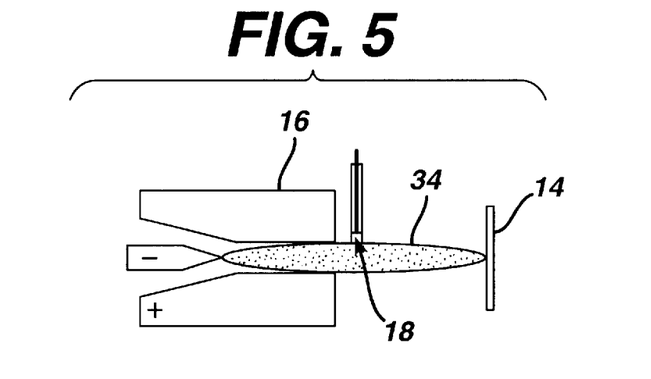
Figure 6:
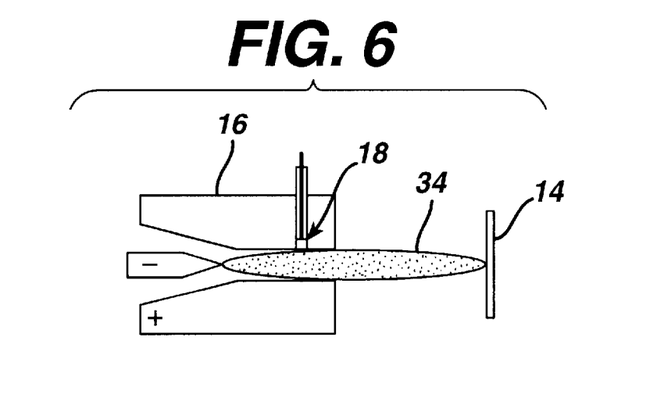

Various apparatus configurations are suitable in the invention. For example, FIGS. 4, 5 and 6 show versions of suitable DC APS torches. FIG. 4 shows a torch 16 with a coaxial, integral liquid injector 18, FIG. 5 shows a torch 16 with an external radial injector 18 and FIG. 6 shows a torch 16 with an integral, internal radial injector 18.

Figure 7:
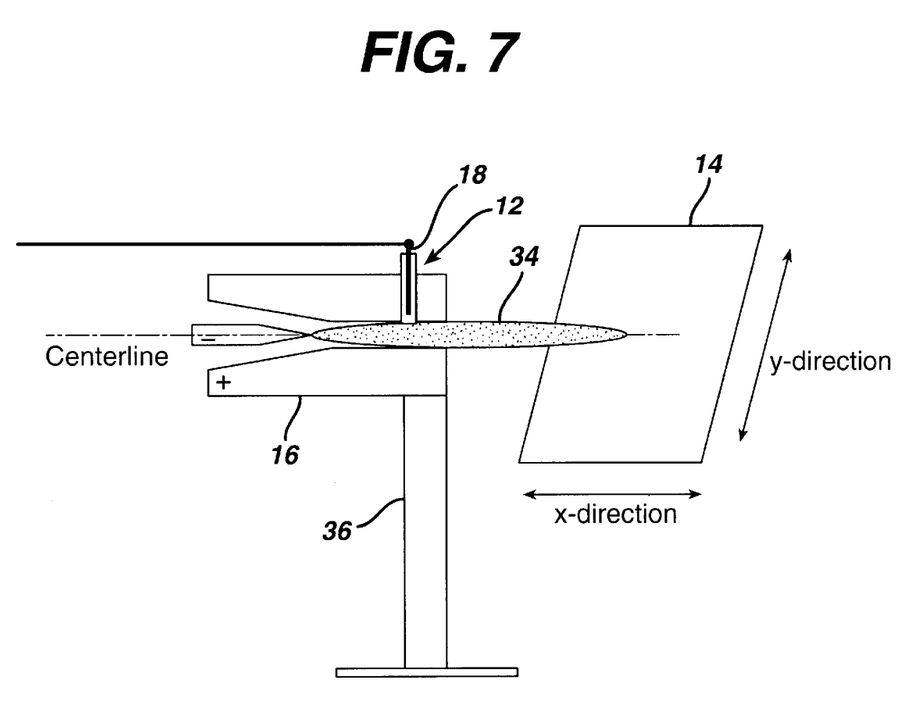
FIG. 7 is a schematic representation of an APS apparatus and supported substrate.

Various torch/substrate manipulation configurations are possible. For example, the torch can be fixed and the substrate position manipulated with respect to the torch or the torch can be manipulated and the substrate fixed or both torch and substrate manipulated with respect to one another to provide various substrate coatings. Concerted torch/substrate manipulation is a preferred embodiment, as is commonly used in coating deposition on gas turbine airfoils. FIG. 7 is a schematic representation of a fixed APS apparatus 12 including torch 16 and fixed torch mount 36 and manipulated substrate 14. In FIG. 7, the substrate 14 is mounted on a flat surface such as an X-Y robotic positioning table. The table and supported substrate 14 can be positioned by a motorized drive mechanism to any position with respect to the torch 16.

The substrate temperature can be controlled by the speed at which the APS torch traverses the substrate. Alternatively, the temperature can be controlled by directing cooling jets of gas at a particular substrate location or by directing relatively hot jets of gas to a location. Substrate temperature can be controlled so that the atomized precursors from jet 30 deposit in a columnar microstructure form. The in plane elastic modulus of a vapor deposited TBC is nearly zero. Hence, a columnar microstructure form of a coating provides outstanding test life to a coated part. Additionally, the density of a vapor deposited TBC is high, from 60 to 80% of theoretical density. High density is a necessary prerequisite for structural integrity of a TBC. For example, high density provides impact damage resistance to a gas turbine airfoil.

The method can prepare a deposited gradient array of candidate TBCs on a substrate that can then be subjected to a screening method. For example, candidate TBCs can be tested by the flash method (ASTM E1461-92) for thermal diffusivity of solids. A preferred apparatus for conducting the flash method comprises four short-pulse xenon flashlamps surrounding a high bandwidth far infrared camera. The thermal diffusivity measurements involve first uniformly irradiating a sample with high power short-pulse xenon flashlamps and then recording a sample time temperature history. Thermal images can be simultaneously acquired from the entire combinatorial library with a high bandwidth 3–6 micron wavelength infrared camera. For example, relative differences between different TBC chemistries and reference chemistries (e.g. 7YSZ) can be quickly obtained by simultaneously determining thermal diffusivity of the entire combinatorial library. If desired, thermal diffusivity can be converted to thermal conductivity using specific heat and bulk density, which can be separately measured. For example, the candidate TBC array can be aged (e.g. 1200° C. (220° F.)/2 hr/air) and thermal diffusivities re-measured to determine if composition changes effect an increase in thermal conductivity typically associated with high temperature annealing The following Example describes a preferred embodiment of the invention.

EXAMPLE

In this example, $Y_2O_3$—$ZrO_2$ oxide coatings were prepared by the present invention using an aqueous solution containing a plurality of metal ions as precursors. The coating experiments were performed using a Sulzer-Metco 7MB plasma torch. Substrates were 1"×2"×⅛" stainless steel plates coated with NiCrAlY bond coats. Liquid precursors were prepared by dissolving zirconium sulfate and yttrium sulfate in distilled water in concentrations of 0.185 and 0.009 moles/liter, respectively. The reactants were atomized and injected into a plasma jet through a pneumatic atomizer located outside the nozzle exit of the plasma torch. Solution feed rate was controlled by a DC liquid pump to a rate of about 40 ml/min. Argon was used as an atomizing gas. The torch plasma gun was mounted on a commercial six-axis robot that was capable of linear traversing speeds of up to 1000 mm/sec. Substrate temperatures were monitored during spraying by thermocouples attached to the back of the substrate. The substrate was preheated by the plasma torch before injection of the dissolved reactants. Experimental conditions were as following:

| | |
|---|---|
| Argon primary plasma gas: | 100 scfh |
| Helium secondary plasma gas: | 45 scfh |
| Gun current: | 900 amp |
| Gun traversing speed: | 110 mm/sec |
| Spray distance: | 2 inches (5.1 cm) |
| Liquid feed rate: | 40 ml/min |
| zirconium sulfate concentration: | 0.185 moles/liter |
| yttrium sulfate concentration: | 0.009 moles/liter |
| Substrate temperature: | ~910 C. |
| Total spray time: | ~15 minutes |

Coatings produced were gray in color. X-ray defraction (XRD) analysis indicated that the coatings were mainly partially stabilized ZrO2 with cubic and/or tetragonal phases. SEM micrographs indicated that the coatings comprised columnar microstructures.

Figure 8:
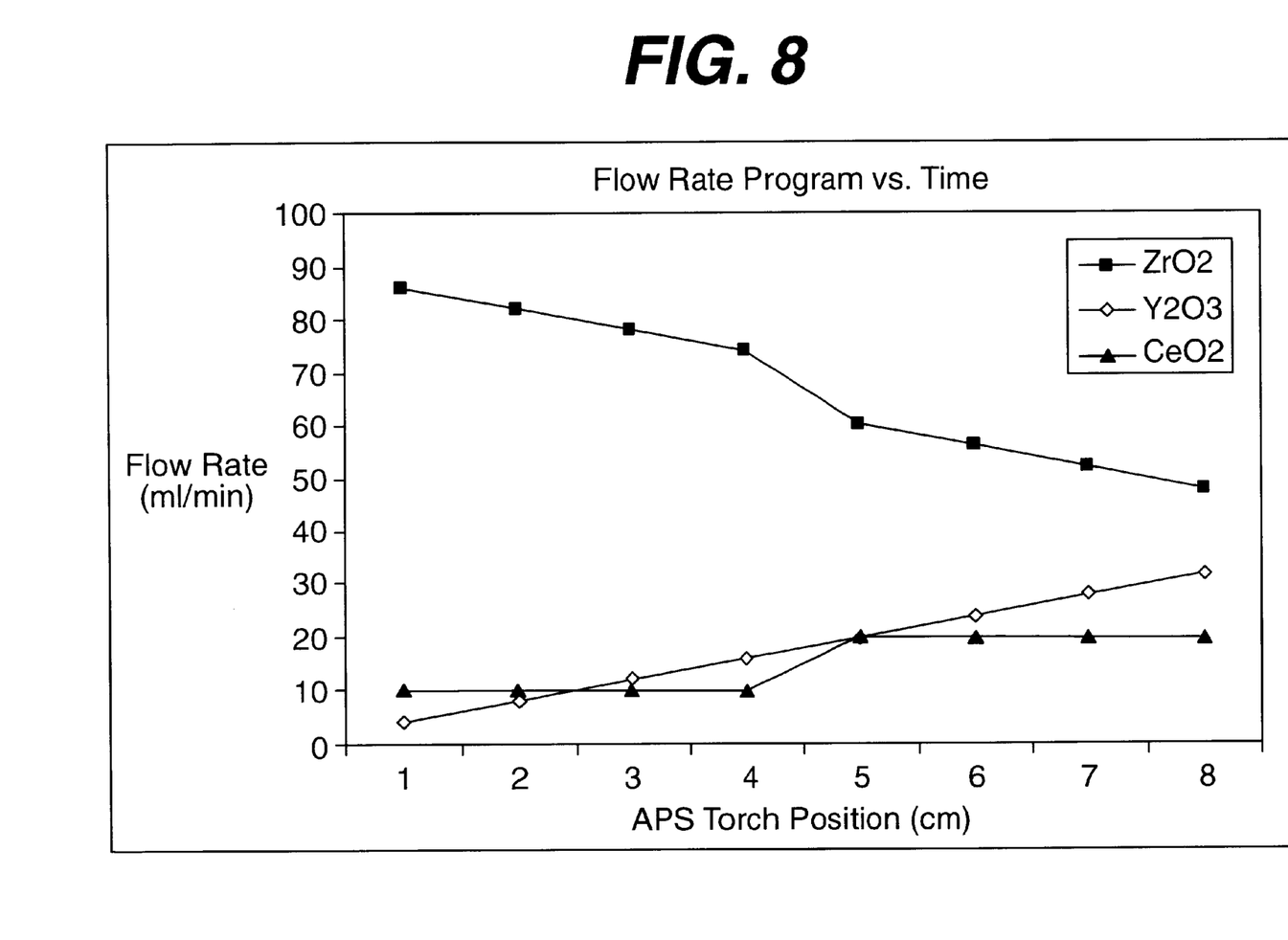
FIG. 8 is a chart of a flow rate program.

Continuous gradients of the TBC can be produced by timing the flow rates of the liquid delivery pumps with the position of the APS torch. A representative example of a flow rate program vs. time is presented in FIG. 8. FIG. 8 shows a flow rate (ml/min) for three different solutions, $Y_2O_3$, $ZrO_2$, and $CeO_2$ at given APS torch positions (cm).

FIG. 8 illustrates a flow program that sampled $ZrO_2$ from 48 to 60 and from 74 to 85 ml/min, in increments of 4 ml/min, $Y_2O_3$ from 4 to 32 ml/min, in increments of 4 ml/min and $CeO_2$ from 10 to 20 ml/min in increments of 10 ml/min is presented.

Figure 9:
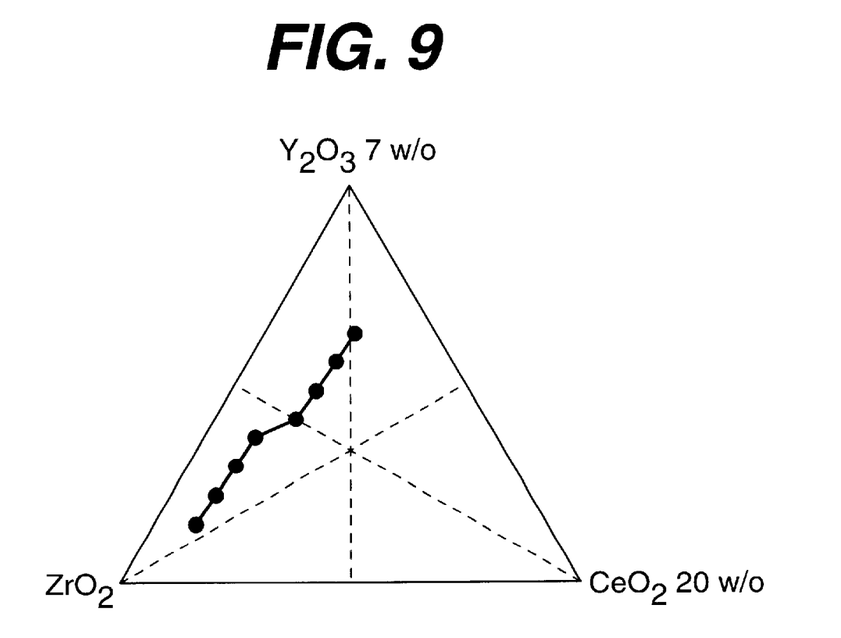
FIG. 9 is a ternary phase diagram.
Figure 10:
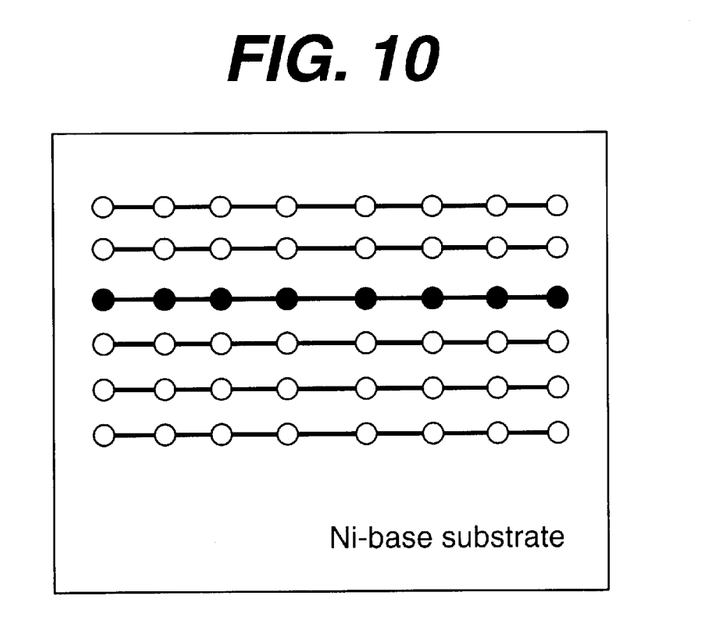
FIG. 10 is a schematic representation of a coated substrate.

FIG. 9 shows a ternary phase diagram of gradients as coated by the APS torch onto a Ni-base substrate and FIG. 10 is a representation of the substrate. In FIG. 9, the filled black circles represent the composition gradient in the deposited coating. On an actual Ni-base substrate, the gradient may be positioned in a line with other adjacent gradient lines, as in FIG. 10.

While preferred embodiments of the invention have been described, the present invention is capable of variation and modification and therefore should not be limited to the precise details of the Example. The invention includes changes and alterations that fall within the purview of the following claims.

What is claimed is:

1. A method comprising:
   (A) selecting a multiplicity of thermal barrier candidate coating precursors;
   (B) controllably air plasma spraying the multiplicity of coating precursors onto a substrate to form a continuous gradient of thermal barrier candidate coatings, wherein a composition of a coating in the gradient is identifiable by its position on the substrate;
   (C) screening the continuous gradient by a procedure to determine a coating property; and
   (D) identifying a composition with a respective coating property according to its position on the substrate.

2. The method of claim 1, additionally comprising applying said composition identified in (D) onto a gas turbine engine part as a thermal barrier coating.

3. The method of claim 1, wherein said precursors are dissolved.

4. The method of claim 1, wherein the coating property is a thermal barrier coating property.

5. The method of claim 1, wherein said method further comprises reiterating (A), (B), (C) and (D) wherein a successive candidate thermal barrier coating precursor is selected for the reiterating as a result of identification of a composition having an improved thermal barrier coating property according to a preceding iteration of (A), (B), (C) and (D).

6. A method of forming an array of thermal barrier coating candidates, comprising:
   forming a solution of thermal barrier coating precursors;
   injecting said solution into a plasma jet of an APS; and
   directing said plasma jet toward a substrate to deposit a gradient film formed from said precursors onto said substrate.

7. The method of claim 6, further comprising controlling a constituency of said solution and controlling relative positions of said APS and a substrate to deposit said gradient film.

8. The method of claim 6, wherein said solution is an atomized aqueous solution containing at least two metal salt precursors.

9. The method of claim 6, wherein said solution contains salts of yttrium and zirconium.

10. The method of claim 6, wherein said solution contains salts of yttrium, zirconium and cesium.

11. A method, comprising:
   (A) steps of (i) simultaneously forming a controlled pattern of candidate TBC coatings on a substrate wherein said controlled pattern comprises a gradient of coatings on said substrate and said candidate TBC coatings are tagged by their location in said gradient; and (ii) determining a thermal barrier property of said coatings.

12. The method of claim 11, wherein said controlled pattern of candidate TBC coatings is formed by air plasma spray.

13. The method of claim 11, additionally comprising: (B) reiterating (A) wherein successive candidate TBC coatings are selected as a result of an evaluating step (ii) of a preceding iteration or as a result of evaluating steps (iii) of preceding iterations of (A).

14. The method of claim 11, wherein said determining step (ii) comprises determining diffusivity.

15. The method of claim 11, wherein said determining step (ii) comprises determining diffusivity by a flash method.

* * * * *